(12) United States Patent
Adamski et al.

(10) Patent No.: US 8,106,711 B2
(45) Date of Patent: Jan. 31, 2012

(54) STACKED PRE-DRIVER AMPLIFIER

(75) Inventors: Jaroslaw Edward Adamski, Streamwood, IL (US); Vikas Sharma, Elgin, IL (US); Dan William Nobbe, Crystal Lake, IL (US)

(73) Assignee: Peregrine Semiconductor Coporation, San Diego, CA (US)

( * ) Notice: Subject to any disclaimer, the term of this patent is extended or adjusted under 35 U.S.C. 154(b) by 0 days.

(21) Appl. No.: 12/590,839

(22) Filed: Nov. 12, 2009

(65) Prior Publication Data

US 2011/0109393 A1 May 12, 2011

(51) Int. Cl.
  *H03F 3/68* (2006.01)
(52) U.S. Cl. ............... 330/295; 330/124 R; 330/297
(58) Field of Classification Search ............... 330/295, 330/53, 84, 310–311, 124 R, 286, 98, 133, 330/150

See application file for complete search history.

(56) References Cited

U.S. PATENT DOCUMENTS

| 7,248,120 | B2 | 7/2007 | Burgener et al. |
| 7,961,052 | B2 | 6/2011 | Bacon et al. |
| 2010/0237941 | A1* | 9/2010 | Goldfarb et al. ............. 330/253 |

OTHER PUBLICATIONS

Tran, Pablo N., Notice of Allowance received from the USPTO dated May 19, 2011 for related U.S. Appl. No. 11/501,125, 11 pgs.
Nguyen, Hieu P., Office Action received from the USPTO for related U.S. Appl. No. 12/657,727 dated Jun. 10, 2011, 12 pgs.
Choe, Henry, Office Action received from the USPTO for related U.S. Appl. No. 12/657,728 dated Jun. 15, 2011, 4 pgs.

* cited by examiner

*Primary Examiner* — Hieu Nguyen
(74) *Attorney, Agent, or Firm* — Jaquez & Associates; Martin J. Jaquez, Esq.; Alessandro Steinfl, Esq.

(57) ABSTRACT

A stacked pre-driver stage and a power amplifier including the stacked pre-driver stage are described. The stacked pre-driver stage comprises stacked pre-drivers arranged in series between a supply voltage and a reference voltage. Each pre-driver includes a pre-driving amplifier, together with MOS transistors. Each pre-driver is subject, in operation, to a voltage difference which is inferior to a maximum allowed use voltage of the MOS transistors with a largely reduced voltage drop across the regulator included in the power amplifier.

23 Claims, 5 Drawing Sheets

STACKED PRE-DRIVER AMPLIFIER

BACKGROUND

1. Field

The present disclosure relates to amplifiers. More specifically, it relates to a stacked pre-driver amplifier and to devices using a stacked pre-driver amplifier, such as power amplifiers having a stacked pre-driver amplifier.

2. Description of Related Art

Radio frequency power amplifiers are commonly used in many applications. Often, they are used in consumer battery-powered applications such as mobile telephones, for which power efficiency is a very important attribute.

As semiconductor processes shrink to smaller dimensions in order to achieve increased performance, reliability criteria cause a reduction in the maximum allowed voltage across the terminals of a transistor. This maximum allowed voltage is defined as Vuse. Common battery voltages can exceed 3.5V, while maximum transistor voltages may be 2.5V or even less. The voltage imposed on a pre-driver stage of a power amplifier must be reduced from the battery voltage down to Vuse. This may be accomplished by several means known to one skilled in the circuit design arts. 1) DC-DC voltage converters can be used to provide a lower voltage, but power is lost in the conversion efficiency and there is significant cost in creating a DC-DC converter. 2) A resistor divider can be used to reduce the voltage from the battery voltage to the use voltage, but the power dissipated in the resistor divider is wasted as heat, resulting in reduced efficiency of the overall amplifier circuit. 3) Similarly, a transistor having a variable bias can be used to provide a voltage drop that can be changed as desired. However, the power dissipated in the transistor is also wasted as heat, resulting in reduced efficiency.

The above problem is illustrated in FIG. 1, which shows a block diagram of a prior art radio frequency power amplifier (PA) with a pre-driver circuit (102). The pre-driver circuit (102) comprises a pre-driver amplifier (104) and transistors (106), (108). Regulator (110) is in series with transistors (106) and (108) between a power supply voltage Vbat and a reference voltage Vref. The function of regulator (110) is familiar to one skilled in the circuit design arts and could be any of several different designs. For example, it could be a stack of p-channel transistors, or any of several other circuit topologies.

Vbat can be, for example, 3.5V (as is common with mobile telephones). On the other hand, as also described above, a typical 0.25 μm CMOS process has a maximum voltage (Vuse) allowed across any two terminals of a transistor of 2.5V. Such limitation is due to physical degradation effects known to one skilled in the art of semiconductor device design and may include gate oxide breakdown due to so-called time-dependent dielectric breakdown (TDDB) or so-called hot carrier injection (HCI). These physical phenomena cause degradation of device performance of the system or even failure of the system. The rule for the maximum voltage between any two terminals of a transistor should therefore be strictly followed in order to meet reliability requirements of the system.

Referring again to the circuit in FIG. 1, if Vbat is 3.5V and Vref is electrical ground, the power supply differential voltage is 3.5 Volts. Vin (112) is an external source signal that increases and decreases in value over time and is capacitively coupled to the driver amplifier (104). The driver amplifier (104) outputs a signal that is high when Vin (112) is high and low when Vin (112) is low. The highest voltage that can be output from the driver amplifier (104) is Vpre. The lowest voltage that can be output from the driver amplifier (104) is Vref.

As is typical with CMOS inverter arrangements, when the output of the driver amplifier (104) is close to Vpre, the p-channel transistor (106) is turned OFF and the n-channel transistor (108) is turned ON. As a consequence of this, the input voltage Vg1 to the PA (114) is pulled down close to Vref.

At this point, if it is assumed that Vdrop of regulator (110) is close to zero, then the voltage present at the source of the p-channel transistor (106) is approximately Vbat and the voltage present at the drain of the same p-channel transistor (106) is approximately Vref. Therefore, if Vbat is assumed to be equal to 3.5V and Vref is assumed to be equal to electrical ground, then Vds=Vdrain−Vsource of the p-channel transistor (106) is approximately 3.5V. If the above mentioned rule for Vuse sets a maximum amount of 2.5V, then this situation violates the rule for Vuse.

On the other hand, when the output of the driver amplifier (104) is close to Vref, the p-channel transistor (106) is turned ON and the n-channel transistor (108) is turned OFF. As a consequence, the input voltage Vg1 to the PA is pulled up close to Vpre.

If Vdrop of the regulator (110) is assumed to be close to zero, then Vds of the n-channel transistor (108) is close to Vbat−Vref. Therefore, if Vbat is 3.5V and Vref is 0V, then Vds of the n-channel transistor (108) is close to 3.5V, which violates the Vuse rule.

As noted above, one possible solution is to increase Vdrop, for example to 1.3 V, by changing the Vbias of the regulator (110). Should this happen, the Vds of the p-channel transistor (106) or the n-channel transistor (108) is reduced to 2.2V, thus satisfying the Vuse rule. However, such a possible solution increases power dissipation in the regulator (110). Such power would be wasted as heat, reducing the overall efficiency of the power amplifier (PA).

SUMMARY

According to a first aspect, an amplifier for amplifying an input signal is provided, comprising: a first amplifying stage connected with a second amplifying stage, wherein: the first amplifying stage comprises at least two amplifying circuits connected in series, each amplifying circuit receiving as input the input signal, each amplifying circuit having an output, and the outputs of the amplifying circuits of the first amplifying stage are input to the second amplifying stage.

According to a second aspect, a power amplifier for amplifying an input carrier signal is provided, comprising: a stacked pre-driver stage, the stacked pre-driver stage comprising a plurality of stacked pre-drivers arranged in series between a supply voltage and a reference voltage, each pre-driver comprising a pre-driving amplifier, the input carrier signal being fed, in operation, to each pre-driver, outputs of the stacked pre-drivers being combined to form an output of the stacked pre-driver stage; a driver stage receiving the output of the stacked pre-driver stage; and a regulator located between a power supply supplying the supply voltage and the stacked pre-driver stage, wherein each pre-driver comprises MOS transistors and is subject to a voltage difference which is inferior to a maximum allowed use voltage of the MOS transistors and wherein voltage drop across the regulator is small when compared to the voltage difference to which the stacked pre-driver stage is subjected.

According to a third aspect, a power amplifier for amplifying an input carrier signal is provided, comprising: a stacked pre-driver stage, the stacked pre-driver stage comprising a plurality of stacked pre-drivers arranged in series between a supply voltage and a reference voltage, each pre-driver comprising a pre-driving amplifier, the input carrier signal being fed, in operation, to each pre-driver, outputs of the stacked pre-drivers forming outputs of the stacked pre-driver stage; a driver stage receiving the outputs of the stacked pre-driver stage, the driver stage comprising a plurality of power amplifiers, each power amplifier being in correspondence of a pre-driver and receiving a respective output from a respective pre-driver, outputs of the power amplifiers forming outputs of the driver stage; a regulator located between a power supply supplying the supply voltage and the stacked pre-driver stage, and a power combiner that combines the outputs of the driver stage, wherein each pre-driver comprises MOS transistors and is subject to a voltage difference which is inferior to a maximum allowed use voltage of the MOS transistors and wherein voltage drop across the regulator is small when compared to the voltage difference to which the stacked pre-driver stage is subjected.

According to a fourth aspect, a power amplifier for amplifying an input carrier signal is provided, comprising: a stacked pre-driver stage, the stacked pre-driver stage comprising two stacked pre-drivers arranged in series between a supply voltage and a reference voltage, the input carrier signal being fed, in operation, to each pre-driver, each pre-driver comprising a pre-driving amplifier, outputs of the stacked pre-drivers forming outputs of the stacked pre-driver stage, the output of a first pre-driver being opposite in phase to the output of the second pre-driver; a driver stage receiving the outputs of the stacked pre-driver stage, the driver stage comprising two power amplifiers, a first power amplifier being in correspondence of the first pre-driver and receiving the output of the first pre-driver, the second power amplifier being in correspondence of the second pre-driver and receiving the output of the second pre-driver; a regulator located between a power supply supplying the supply voltage and the stacked pre-driver stage, and a power combiner that combines the outputs of the first power amplifier and second power amplifier, wherein each pre-driver comprises MOS transistors and is subject to a voltage difference which is inferior to a maximum allowed use voltage of the MOS transistors and wherein voltage drop across the regulator is small when compared to the voltage difference to which the stacked pre-driver stage is subjected.

According to a fifth aspect, a power amplifier for amplifying an input carrier signal is provided, comprising: a stacked pre-driver stage, the stacked pre-driver stage comprising two stacked pre-drivers arranged in series between a supply voltage and a reference voltage, each pre-driver comprising a pre-driving amplifier, the input carrier signal being fed, in operation, to each pre-driver, outputs of the stacked pre-drivers forming outputs of the stacked pre-driver stage; a driver stage receiving the outputs of the stacked pre-driver stage, the driver stage comprising two power amplifiers, a first power amplifier being in correspondence of the first pre-driver and receiving the output of the first pre-driver, the second power amplifier being in correspondence of the second pre-driver and receiving the output of the second pre-driver, each of the first and second power amplifier being powered with the supply voltage and the reference voltage; a regulator located between a power supply supplying the supply voltage and the stacked pre-driver stage, and a power combiner that combines the outputs of the driver stage, wherein each pre-driver comprises MOS transistors and is subject to a voltage difference which is inferior to a maximum allowed use voltage of the MOS transistors and wherein voltage drop across the regulator is small when compared to the voltage difference to which the stacked pre-driver stage is subjected.

According to a sixth aspect, a stacked pre-driver stage adapted to be used in a power amplifier circuit for amplification of an input signal is provided, the power amplifier comprising a regulator connected with the stacked pre-driver stage, the stacked pre-driver stage comprising: a plurality of stacked pre-drivers to be arranged in series between a supply voltage and a reference voltage, each pre-driver comprising a pre-driving amplifier, the input signal being fed, in operation, to each pre-driver, wherein each pre-driver comprises MOS transistors and is subject, in operation, to a voltage difference which is inferior to a maximum allowed use voltage of the MOS transistors and wherein voltage drop across the regulator is small when compared to the voltage difference to which the plurality of stacked pre-drivers is subjected.

The above described circuits reduce or eliminate power wasted in reducing voltage from Vbat to Vuse, resulting in improved efficiency.

DETAILED DESCRIPTION

Figure 2:
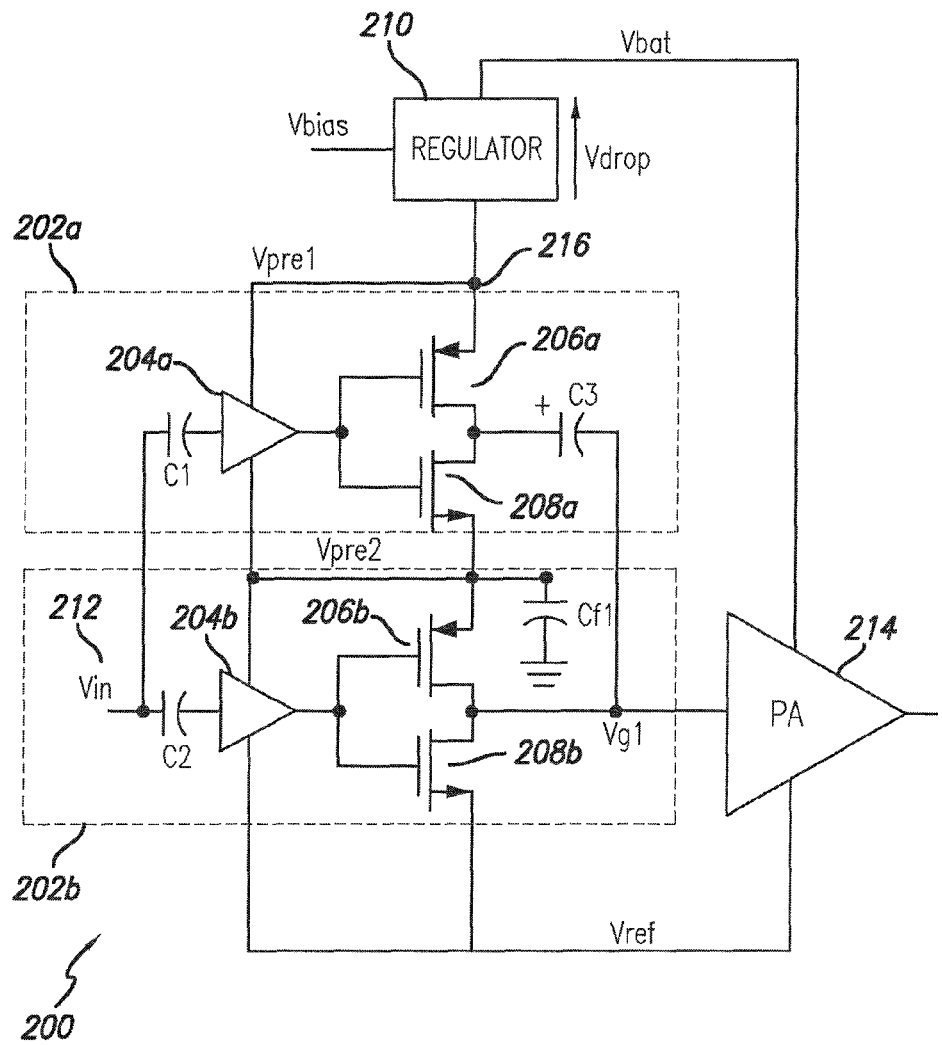
FIG. 2 is a block diagram of a power amplifier with split pre-driver in accordance with a first embodiment of the present disclosure.

FIG. 2 shows a block diagram of a power amplifier with a split pre-driver arrangement in accordance with an embodiment of the present disclosure. As shown in FIG. 2, a first pre-driver circuit (202a) is connected to the power supply voltage Vbat in series with a second pre-driver circuit (202b). Therefore, in accordance with this embodiment, the power supply voltage Vbat−Vref is dropped across Vdrop, Vpre1, and Vpre2. In particular, Vbat−Vref=(Vbat−Vpre1)+(Vpre1−Vpre2)+(Vpre2−Vref). By way of example and not of limitation, Vref can be assumed to be equal to electrical ground and Vdrop of regulator (210) is assumed to be equal to zero. In such exemplary embodiment, it follows that Vpre1=Vbat.

An external source signal Vin (212) is, for example, a RF signal that is capacitively coupled to pre-driver amplifiers (204a) and (204b). In the embodiment of FIG. 2, pre-driver amplifiers (204a) and (204b) amplify the signal Vin (212) without inverting it. Therefore, when Vin (212) is high, the outputs of the pre-driver amplifiers (204a) and (204b) are also both high.

The output of the pre-driver amplifier (204a) feeds into the gates of the p-channel transistor (206a) and the n-channel transistor (208a). When the output of the pre-driver amplifier (204a) is high, the p-channel transistor (206a) is turned OFF, and the n-channel transistor (208a) is turned ON. Therefore, substantially all of the voltage Vpre1−Vpre2 is dropped across the p-channel transistor (206a). If the pre-driver amplifiers (204a) and (204b) are designed to have similar electrical characteristics, and the transistors (206a), (208a) are designed to have similar characteristics to the transistors (206b), (208b), the voltage difference Vpre1−Vref divides evenly, meaning that Vpre1−Vpre2=Vpre2−Vref or, alternatively stated, Vpre2=(Vpre1−Vref)/2. Assuming that Vdrop=0, Vref=0, and Vbat=3.5, Vpre1=3.5V and Vpre2=1.75V. Thus, the voltage across the transistors (206a), (208a) is 1.75V and the voltage across the transistors (206b), (208b) is 1.75V. Therefore, none of the transistors (206a), (208a), (206b), (208b) can have a Vds voltage higher than 1.75V. It follows that all voltages on those transistors are within the Vuse reliability rules.

Referring again to FIG. 2, the output of the first pre-driver stage (202a) is capacitively coupled through a capacitor C3 to the output of the second pre-driver stage (202b). The coupled output Vg1 is connected to the input of a final stage PA (214). In other words, the pre-driver stages (202a), (202b) drive the final stage PA (214). The capacitor C3 allows RF coupling of the two pre-driver outputs while different DC potentials are present at the outputs of the first and second pre-driver stages (202a), (202b). While a capacitive coupling of the outputs is shown in the embodiment of FIG. 2, those skilled in the art will understand that alternative methods can be used to combine the RF power of the two pre-driver outputs. For example, power combiners can be used in some embodiments to combine RF power of the two pre-driver outputs.

Also shown in FIG. 2 is a capacitor Cf1, which can be used to filter the voltage Vpre2 in order to hold it approximately constant across the RF signal swing. As shown in the embodiment of FIG. 2, the use of two stacked pre-drivers (202a), (202b) allows the use of a Vbat that is higher than the Vuse of the circuit, without any wasted power in voltage scaling. While two pre-drivers are shown in the embodiment of FIG. 2, the person skilled in the art will appreciate that a stack of n>2 pre-drivers can also be provided, thus allowing the use of a Vbat equal to Vuse×n.

In the embodiment shown in FIG. 2, the regulator (210) can turn OFF the pre-driver stages (202a), (202b) by preventing current flow from Vbat to the pre-driver stages (202a), (202b). In particular, the input Vbias is operatively coupled to the regulator (210). The Vbias acts as an externally-supplied control signal. When Vbias is high, for example, the Vdrop across the regulator (210) may be very small, and the pre-driver stages (202a), (202b) are powered. On the other hand, when Vbias is low, the Vdrop is equal to Vbat, and the pre-driver circuitry does not consume any power.

The regulator (210) can also be used to separately control the power supply voltage presented to the pre-driver stages (202a), (202b) and the final PA stage (214). Moreover, control of the Vpre1 and Vpre2 voltages by way of the regulator (210) enables higher efficiency of the power amplifier (214) at maximum power by limiting the loss of power across the regulator (210), given that only a very small voltage drop is present across the regulator (210) compared to the voltage difference to which the stacked pre-driver stage is subjected.

By way of example, assuming typical nominal battery and maximum RF power conditions for the circuit in question with battery voltage of 3.5V, required pre-driver current to drive the input of the RF amplifier output stage of 200 mA, maximum voltage across devices of 2V, the voltage drop across the pre-driver regulator should be 1.5V to maintain device save operating conditions, resulting in a power loss of 1.5*0.2 A=0.3 W. With a circuit solution of two stacked pre-drivers, the full battery voltage could be applied to the pre-driver stack through a regulator with minimum voltage drop. For example, a typical regulator for this application would have a minimum resistance of 0.5 Ohms resulting in a voltage drop of 0.2 A*0.5 Ohms=0.1V. The 0.1V voltage drop across the regulator is negligible as compared to the voltage drop across the stack of pre-drivers that is 3.4V. The power loss in the regulator would be only 0.2 A*0.2 A*0.5 Ohms=0.02 W in this case.

Power savings can be also realized when a larger battery voltage is present, for example during battery charging, where the voltage could be as high as 4.5V. In this case the regulator should drop the voltage by 0.5V to maintain save operating conditions for the stack of two pre-drivers. The voltage drop across the regulator is still small when compared to the voltage difference to which the stack of pre-drivers is subjected.

As a consequence of the embodiment described above, the split topology shown in FIG. 2 allows use of transistors having a breakdown voltage that is less than Vbat−Vref. The efficiency of the PA is maintained at a high level. In particular, because the power used in both of the pre-driver stages (202a), (202b) is used for amplification in the pre-driver, there is no power wasted in reducing the voltage from Vbat to Vuse. This results in improved power efficiency of the amplifier.

Figure 1:
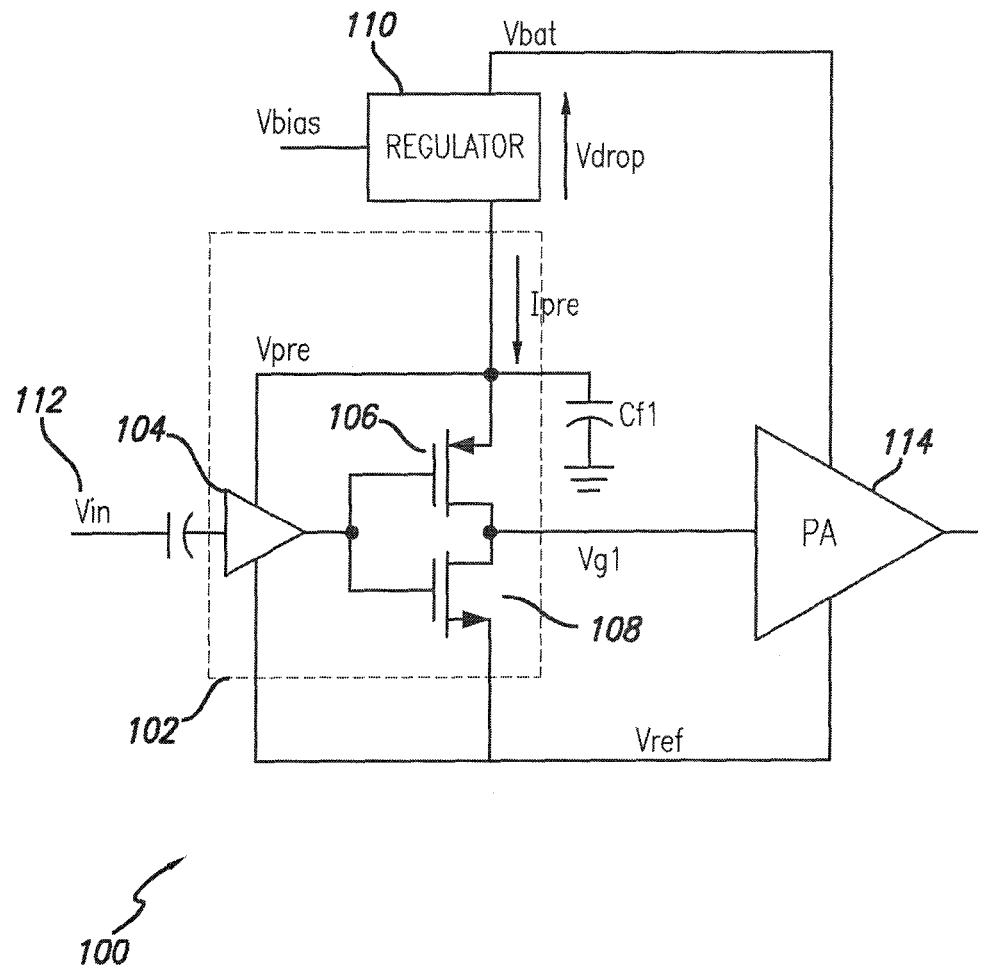
FIG. 1 is a block diagram of a prior art power amplifier with pre-driver.

Those skilled in the electronic design arts will note that, due to the fact that Vdrop can be essentially equal to zero, approximately the entire battery voltage Vbat is present at a node (216). In particular, the regulator (210) exhibits only a small voltage drop due to its ON resistance, usually on the order of about 100 mV. Therefore, a higher percentage (as compared to the circuit of FIG. 1) of the power that is consumed by the pre-drivers (202a), (202b) is used to drive the input of the PA (214), resulting in a higher overall efficiency of the PA (214) calculated with the inclusion of pre-driver power.

Figure 3:
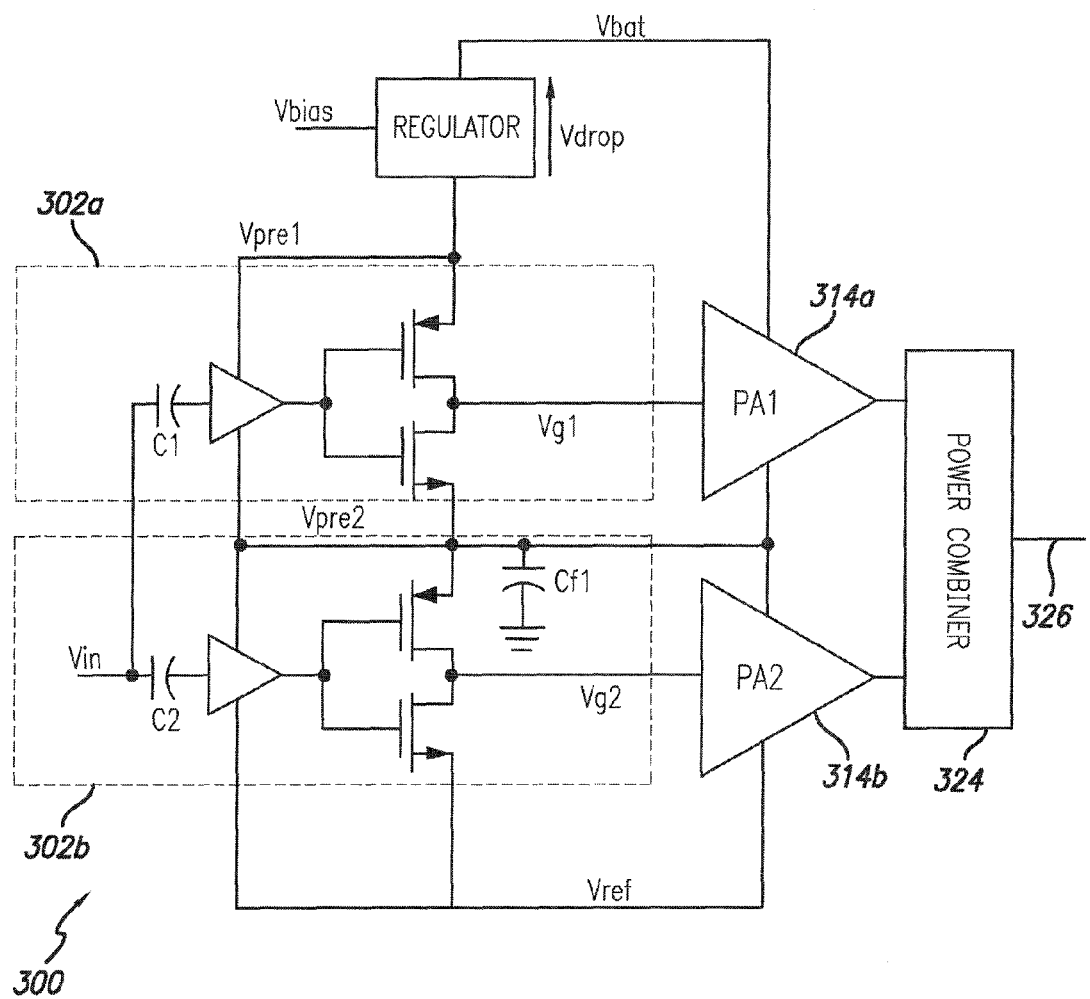
FIG. 3 is a block diagram of a power amplifier with split pre-driver in accordance with a second embodiment of the present disclosure.

FIG. 3 shows a block diagram of a further embodiment of the present disclosure, where stacked pre-drivers drive separate power amplifiers. In particular, in the embodiment of FIG. 3, a pre-driver stage (302a) is connected with a PA1 (314a), while a pre-driver stage (302b) is connected with a PA2 (314b). As shown in the figure, an output Vg1 of the pre-driver stage (302a) is connected to the input of the PA1 (314a), while an output Vg2 of pre-driver stage (302b) is connected to the input of the PA2 (314b).

Those skilled in the electronic design arts will note that the PA1 (314a) and the PA2 (314b) are stacked across the power supply in the same manner as are the pre-driver stages (302a), (302b). Therefore, no voltage level shifting is necessary from each pre-driver to the respective PA. However, if required, DC blocking capacitors can be connected between the output of each pre-driver stage and the input of the respective PA.

As further shown in the embodiment of FIG. 3, the outputs of the power amplifiers (314a), (314b) are combined in a power combiner (324). The power combiner (324) has an output (326) that comprises the power amplifier output. RF power combiners are well known to those skilled in the art of RF circuit design. Any suitable on-chip or off-chip power combiner technology can be used.

By way of example and not of limitation, in the simplest case embodiment, the PA outputs are connected to each other, for example through a DC blocking capacitor, since they are in the same phase. In this simplest case embodiment, the output impedance of the two amplifiers is half that of a single, comparable PA. Such an embodiment has better impedance match between the RF output and the impedance of the device receiving the RF power if the receiving device has lower input impedance than the output impedance of a single PA. Better impedance match allows for higher power efficiency of the circuit.

In yet another embodiment, an off-chip power combiner with very high efficiency can be used to combine the PA outputs and convert the output impedance at high efficiency to a different desired output impedance, for example, 50 ohms.

Figure 4:
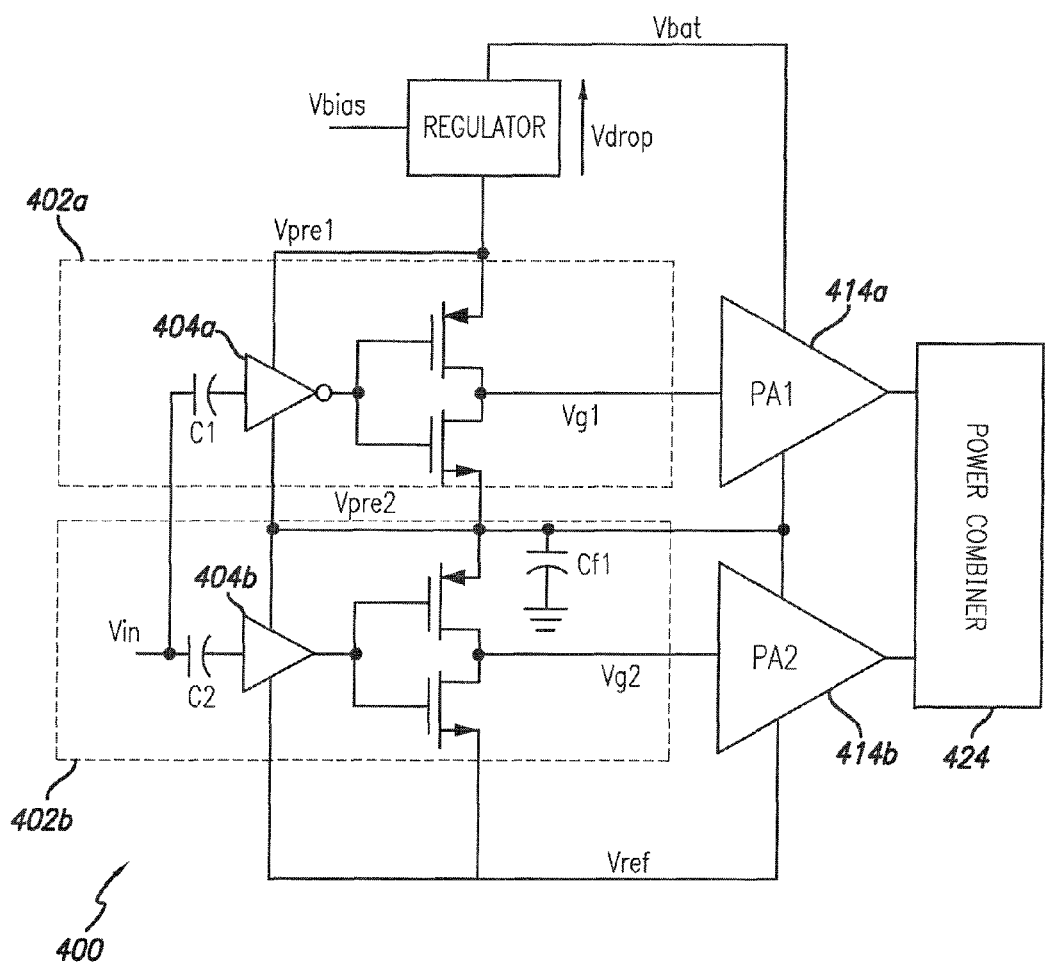
FIG. 4 is a block diagram of a power amplifier with split pre-driver in accordance with a third embodiment of the present disclosure.

FIG. 4 shows a block diagram of another embodiment of the present disclosure, where stacked differential pre-drivers are included. In particular, outputs Vg1, Vg2 of pre-driver stages (402a), (402b) are designed to be opposite in phase, forming a differential amplifier. As shown in FIG. 4, the output of a driver amplifier (404a) is inverted compared to the output of driver amplifier (404b). Therefore, the outputs of a PA1 (414a) and a PA2 (414b) are in opposite phase to each other. As a consequence, the outputs of the PA1 (414a) and the PA2 (414b) can be used to drive, for example, a differential device.

The embodiment shown in FIG. 4 shows, by way of example, a differential power combiner. It will be obvious to those skilled in the RF circuit design arts that other differentially-driven devices can be substituted for the differential power combiner such as a transformer, antenna, or any other convenient differential device. By way of example, the outputs of pre-driver stages (402a) and (402b) could drive a single differential driver stage or output stage having a (+) input connected to one of the two outputs and a (−) input connected to the other output.

Figure 5:
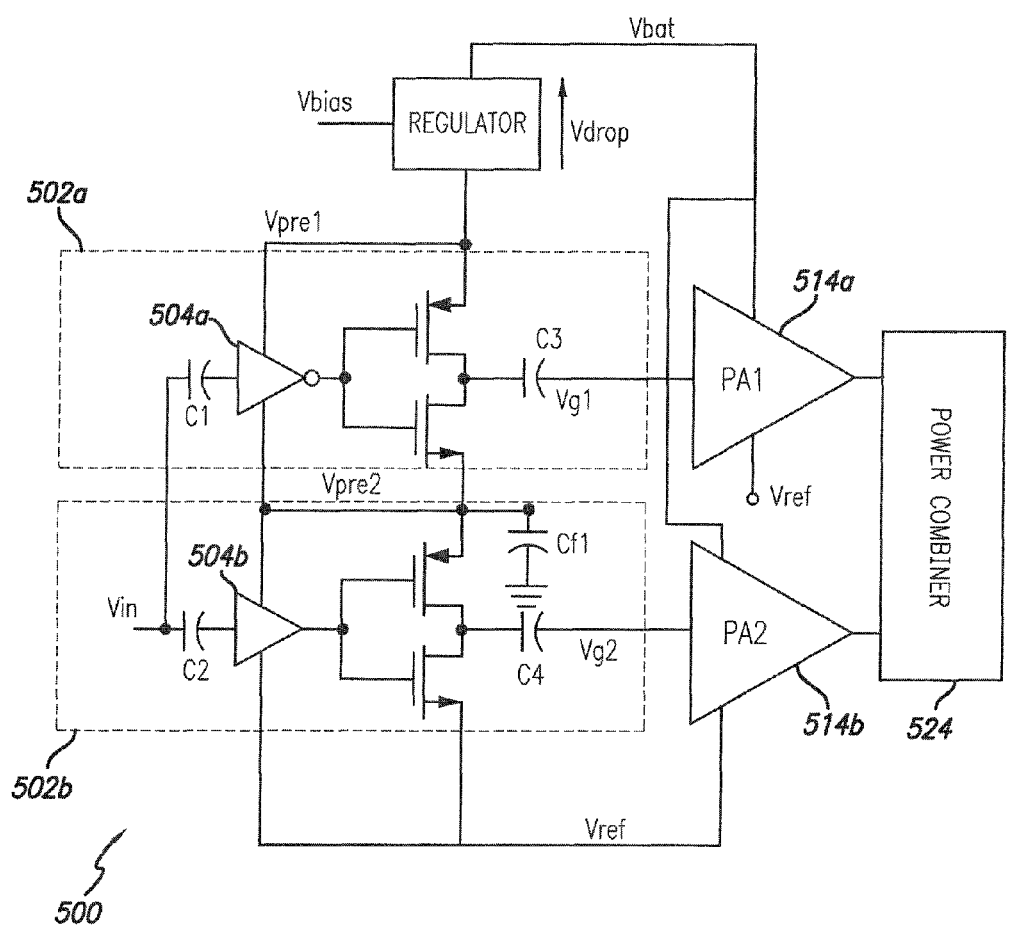
FIG. 5 is a block diagram of a power amplifier with split pre-driver in accordance with a fourth embodiment of the present disclosure.

FIG. 5 shows a block diagram of yet another embodiment of the present disclosed power amplifier, where separate power amplifiers PA1 (514a), PA2 (514b) are powered individually. In particular, as shown in FIG. 5, each PA1 (514a) and PA2 (514b) is powered with Vbat and Vref. Therefore, in the embodiment of FIG. 5, both PAs have the full power supply available for amplification of an input signal.

An output of a pre-driver stage (502a) is capacitively coupled, through a capacitor C3, to an input of the PA1 (514a). The capacitor C3 acts as a DC blocking capacitor, allowing the output of the pre-driver stage (502a), which swings from Vpre1 to Vpre2, to input power into the PA1 (514a). Similarly, the output of a pre-driver stage (502b) is capacitively coupled, through a capacitor C4, to the input of PA2 (514b). The capacitor C4 acts as a DC blocking capacitor, allowing the output of the pre-driver stage (502b), which swings from Vpre2 to Vref, to input power into the PA2 (514b). Those skilled in the electronics art will understand that in most cases a connection between the pre-driver stage (502b) and PA2 (514b) is also possible without DC blocking capacitor C4, due to similar DC voltage requirements at the connection point between pre-driver stage (502b) and PA2 (514b).

In the embodiment shown in FIG. 5, an amplifier driver (504a) has an output that is inverted compared to an amplifier driver (504b). In the embodiment shown in FIG. 5, the output of the circuit is differential. Those skilled in the electronics art will understand that the output of the amplifier driver (504a) can also be made non-inverting with respect to the amplifier driver (504b). In that case, the outputs of the PA1 (514a) and the PA2 (514b) can be summed directly through a power combiner (e.g., the power combiner 524) or through direct connection.

A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

The invention claimed is:

1. An amplifier for amplifying an input signal, comprising:
a first amplifying stage connected with a second amplifying stage, wherein:
the first amplifying stage comprises at least two amplifying circuits connected in series, each amplifying circuit receiving as input the input signal, each amplifying circuit having an output, and
the outputs of the amplifying circuits of the first amplifying stage are input to the second amplifying stage,
wherein the outputs of the amplifying circuits of the first amplifying stage are capacitively combined before being input to the second amplifying stage.

2. The amplifier of claim 1, wherein the first amplifying stage is a pre-driver stage of a power amplifier and the second amplifying stage is a final driver stage of the power amplifier.

3. The amplifier of claim 1, wherein the amplifier is adapted to be powered, during an operative condition, by a power supply generating a supply voltage and a supply current.

4. The amplifier of claim 3, further comprising a regulator located between the power supply and the first amplifying stage.

5. The amplifier of claim 4, wherein voltage drop across the regulator is negligible when compared to voltage drop across the first amplifying stage.

6. The amplifier of claim 3, wherein each amplifying circuit receives as further input the supply current.

7. The amplifier of claim 1, wherein the second amplifying stage comprises one power amplifier, the output of the power amplifier being the output of the amplifier.

8. The amplifier of claim 1, wherein the at least two amplifying circuits are two amplifying circuits.

9. The amplifier of claim 1, wherein the output of a first amplifying circuit of the two amplifying circuits is opposite in phase with the output of the second amplifying circuit of the two amplifying circuits.

10. The amplifier of claim 9, wherein the first amplifying circuit comprises a non-inverting amplifier and the second amplifying circuit comprises an inverting amplifier.

11. The amplifier of claim 10, wherein the first amplifying circuit comprises a non-inverting amplifier and the second amplifying circuit comprises an inverting amplifier.

12. The amplifier of claim 9, wherein the second amplifying stage comprises a differential power amplifier.

13. The amplifier of claim 4, wherein the regulator is adapted to switch the first amplifying stage between an ON condition and an OFF condition.

14. A power amplifier for amplifying an input carrier signal, comprising:
a stacked pre-driver stage, the stacked pre-driver stage comprising a plurality of stacked pre-drivers arranged in series between a supply voltage and a reference voltage, each pre-driver comprising a pre-driving amplifier, the input carrier signal being fed, in operation, to each pre-driver, outputs of the stacked pre-drivers being combined to form an output of the stacked pre-driver stage;
a driver stage receiving the output of the stacked pre-driver stage; and
a regulator located between a power supply supplying the supply voltage and the stacked pre-driver stage, wherein each pre-driver comprises MOS transistors and is subject to a voltage difference which is inferior to a maximum allowed use voltage of the MOS transistors, and wherein voltage drop across the regulator is small when compared to the voltage difference to which the stacked pre-driver stage is subjected.

15. The power amplifier of claim 14, wherein the output of the driver stage is the output of the power amplifier.

16. The power amplifier of claim 14, wherein the outputs of the stacked pre-drivers are capacitively combined.

17. The power amplifier of claim 14, wherein the plurality of stacked pre-drivers arranged in series are a first pre-driver and a second pre-driver, the first pre-driver arranged between a first voltage between the supply voltage and a reference voltage and a second voltage between the supply voltage and the reference voltage, the first voltage being higher than the second voltage, the second pre-driver arranged between the second voltage and the reference voltage.

18. The power amplifier of claim 17, wherein the second voltage is a substantially constant voltage.

19. The power amplifier of claim 14, wherein the input carrier signal is fed to each pre-driver through a capacitive coupling.

20. The power amplifier of claim 14, wherein, in each pre-driver, the MOS transistors comprise a p-channel MOS transistor and an n-channel MOS transistor connected to each other and with the pre-driver amplifier.

21. The power amplifier of claim 20, wherein, for each pre-driver, the output of the pre-driver amplifier is connected with the gate of the p-channel MOS and the gate of the n-channel MOS, and the drains of the p-channel MOS and the n-channel MOS are connected to each other and form the output of the pre-driver.

22. The power amplifier of claim 14, wherein the plurality of stacked pre-drivers are n stacked pre-drivers, and wherein the supply voltage is configurable to be up to n×Vuse, Vuse being said maximum voltage difference to which said MOS transistors are subject, n being $\geq 2$.

23. A stacked pre-driver stage adapted to be used in a power amplifier circuit for amplification of an input signal, the power amplifier comprising a regulator connected with the stacked pre-driver stage, the stacked pre-driver stage comprising:

a plurality of stacked pre-drivers to be arranged in series between a supply voltage and a reference voltage, each pre-driver comprising a pre-driving amplifier, the input signal being fed, in operation, to each pre-driver, wherein each pre-driver comprises MOS transistors and is subject, in operation, to a voltage difference which is inferior to a maximum allowed use voltage of the MOS transistors, and wherein voltage drop across the regulator is small when compared to the voltage difference to which the plurality of stacked pre-drivers is subjected.

* * * * *